United States Patent [19]
Melane et al.

[11] Patent Number: 6,039,414
[45] Date of Patent: *Mar. 21, 2000

[54] MODULAR ELECTRONIC ENCLOSURE HAVING ROTATIONAL MOLDED PLASTIC INTERLOCKING COMPONENTS

[75] Inventors: Marcus L. Melane, Irving; Michael J. Pisterzi, Plano; Edward G. Mills, Prosper; Curtis L. Hargroves, Double Oak, all of Tex.

[73] Assignee: Alcatel USA Sourcing, L.P., Plano, Tex.

[ * ] Notice: This patent is subject to a terminal disclaimer.

[21] Appl. No.: 09/209,693

[22] Filed: Dec. 11, 1998

[51] Int. Cl.$^7$ .................................................. A47B 45/00
[52] U.S. Cl. ........................ 312/205; 312/223.1; 312/287; 312/265.1; 220/812
[58] Field of Search .................................... 361/724, 690, 361/679, 600, 687, 688, 689, 691, 694, 692, 693; 220/811, 812, 826, 836, 839, 8, 4.02, 4.03; 211/26; 312/223.1, 223.2, 324, 287, 205, 213, 327, 328, 107

[56] References Cited
U.S. PATENT DOCUMENTS

| | | |
|---|---|---|
| 670,404 | 3/1901 | Davis .................................. 312/205 X |
| 3,056,639 | 10/1962 | Caminker et al. ............... 312/351.1 X |
| 3,691,432 | 9/1972 | Edfors et al. ........................ 361/724 X |
| 4,997,240 | 3/1991 | Schmalzl et al. .................... 312/265.4 |
| 5,150,277 | 9/1992 | Bainbridge et al. .................... 361/687 |
| 5,352,032 | 10/1994 | Cisternino ........................... 312/263 X |
| 5,576,931 | 11/1996 | Crane, Jr. et al. ....................... 361/687 |
| 5,678,693 | 10/1997 | Tapp et al. .......................... 312/290 X |
| 5,855,290 | 1/1999 | Fahey et al. ....................... 220/4.02 X |

*Primary Examiner*—Janet M. Wilkens
*Attorney, Agent, or Firm*—Locke Liddell & Sapp LLP

[57] ABSTRACT

A modular enclosure includes multiple interlocking molded plastic components and panels to form an exterior structure for the enclosure. The exterior structure provides a protective and aesthetic housing which encloses and covers an interior enclosure housing electronic and mechanical equipment. The exterior interlocking components may be fabricated of plastic utilizing rotationally molding techniques to provide a hollow wall design resulting in structural rigidity and strength to the various external parts and components of the enclosure. The modularity of the present enclosure allows for easy replacement of exterior components without affecting operation of the equipment housed inside the enclosure.

8 Claims, 6 Drawing Sheets

MODULAR ELECTRONIC ENCLOSURE HAVING ROTATIONAL MOLDED PLASTIC INTERLOCKING COMPONENTS

BACKGROUND OF THE INVENTION

Enclosures for housing electrical and mechanical equipment are typically constructed of either steel or aluminum alloys which require an extensive internal frame or utilize exterior skin material as the support structure for the enclosure. Plastic enclosures have been utilized to house primarily small non-energy producing thermal dissipating equipment. Typically, enclosures are manufactured in predetermined and incremental sizes that are ordered and built to the particular size and capacity needed to house components. Such enclosures cannot be modified after manufacture, much less modified in the field after installation.

A need has arisen for an enclosure that can be easily assembled either at a manufacturing facility or in the field and which can be easily expanded to house equipment of different sizes. A need has further arisen for an enclosure that is lightweight and which can be easily repaired in the field without replacement of the entire enclosure.

SUMMARY OF THE INVENTION

In accordance with the present invention, a modular enclosure includes multiple interlocking molded plastic components and panels to form an exterior structure for the enclosure. The exterior structure provides a protective and aesthetic housing which encloses and covers an interior enclosure housing electronic and mechanical equipment. The exterior interlocking components may be fabricated of plastic utilizing rotationally molding techniques to provide a hollow wall design resulting in structural rigidity and strength to the various external parts and components of the enclosure. The modularity of the present enclosure allows for easy replacement of exterior components without affecting operation of the equipment housed inside the enclosure.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
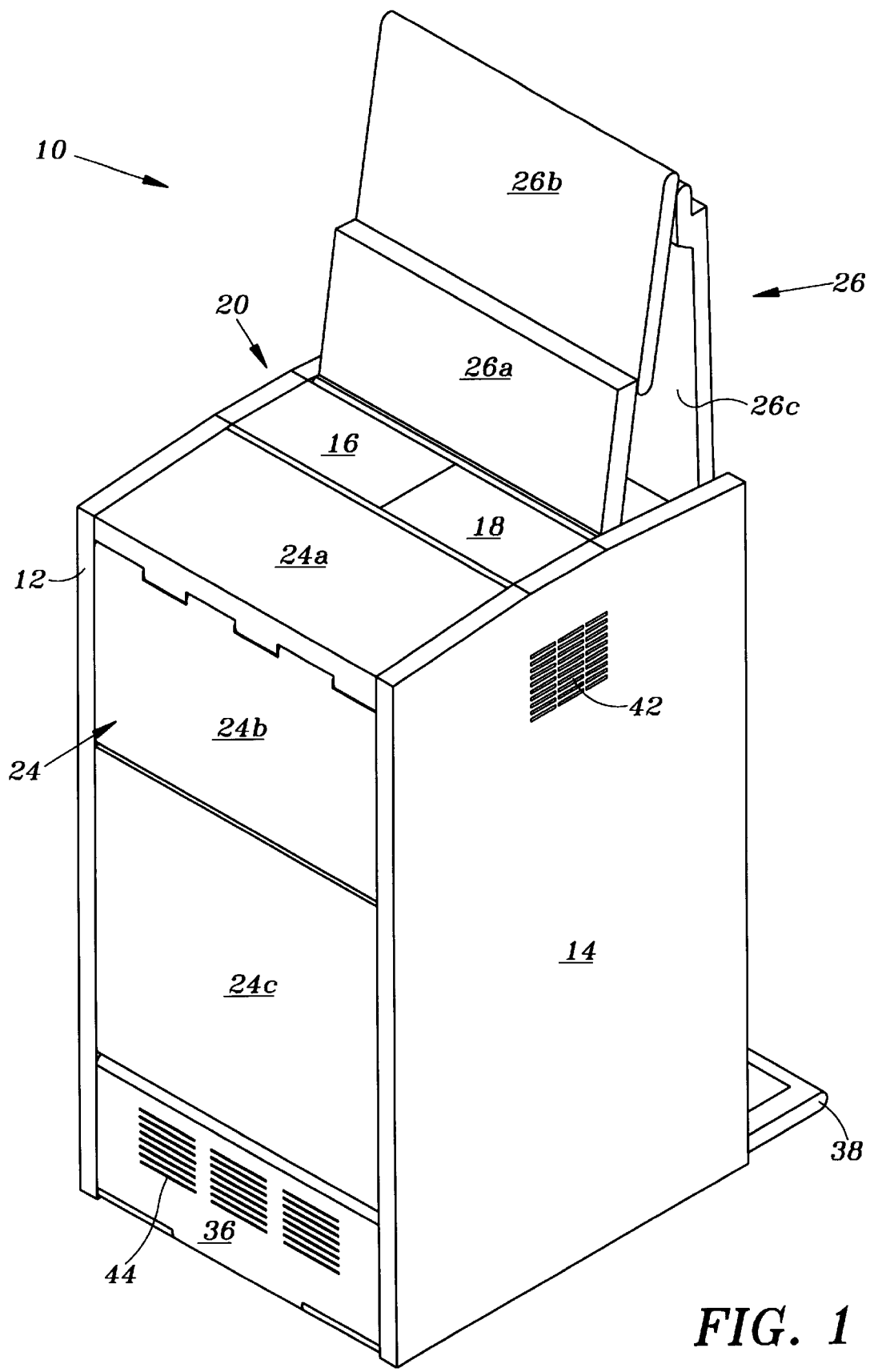
FIG. 1 is a perspective view of the present enclosure illustrating the rear door in the open position.
Figure 2:
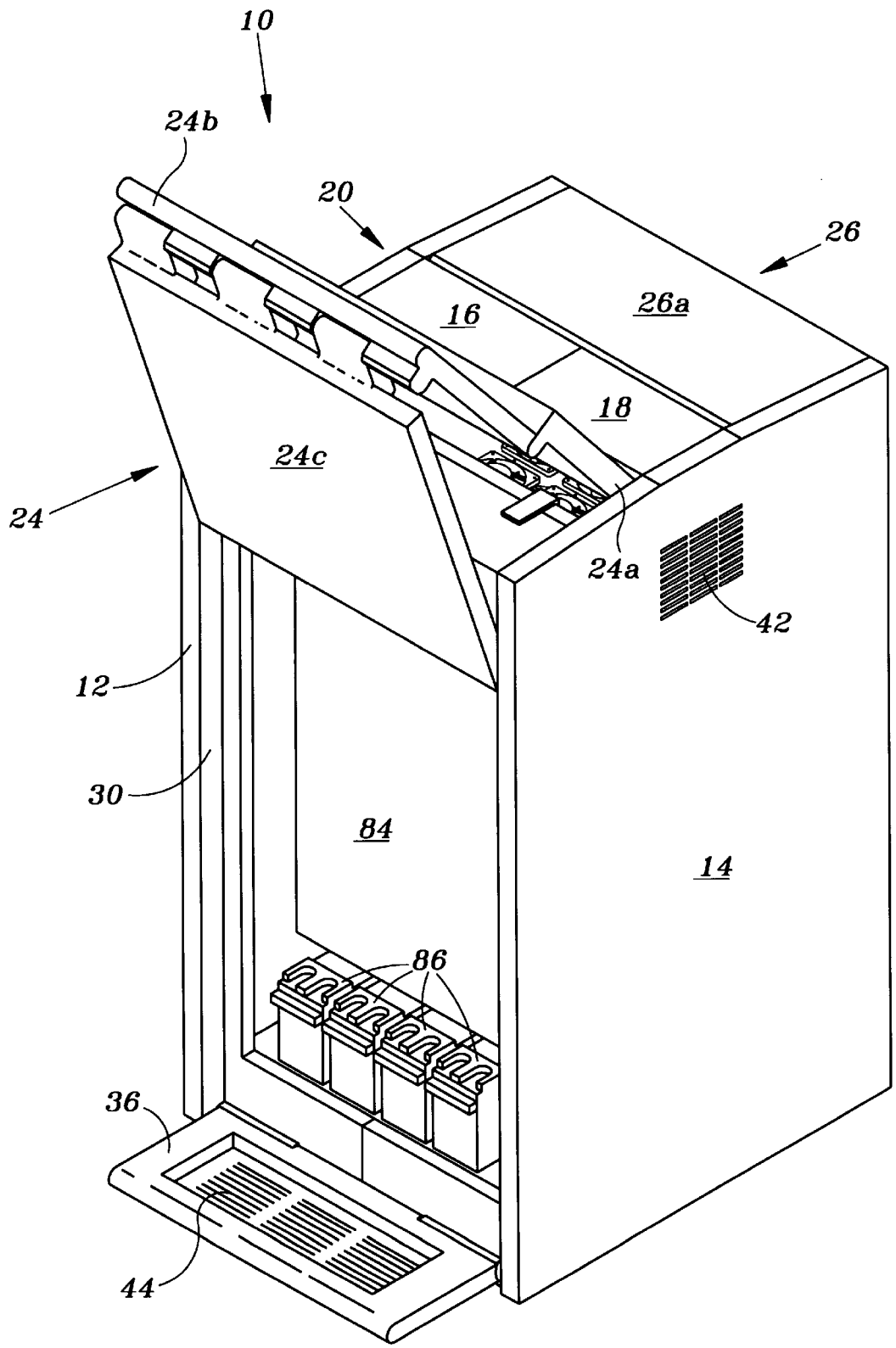
FIG. 2 is a perspective view of the present enclosure of FIG. 1 illustrating the front door in a partially open position and a battery door in the open position.
Figure 3:
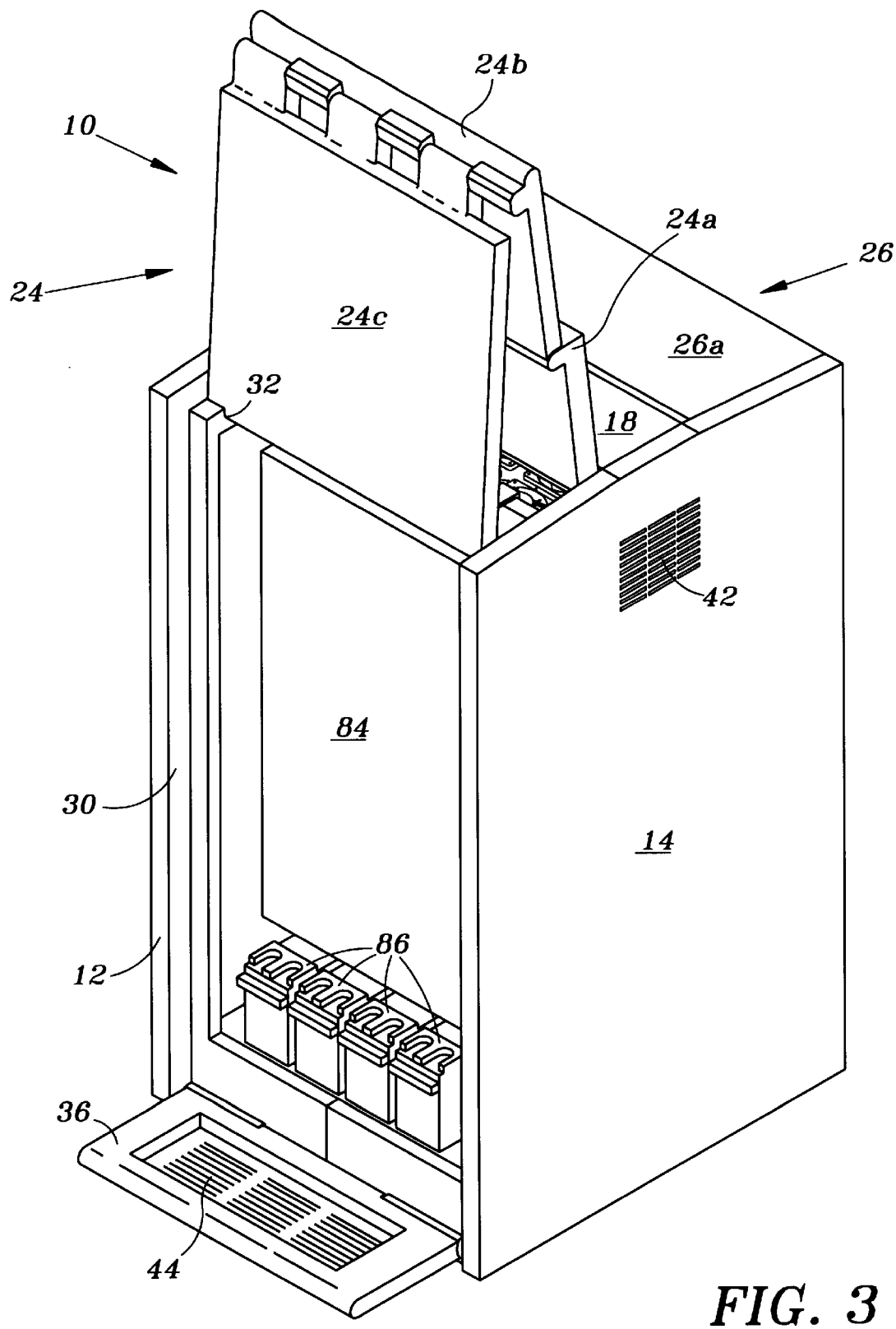
FIG. 3 is a perspective view of the present enclosure of FIG. 1 having a front door fully opened.

Referring simultaneously to FIGS. 1, 2, and 3, the present enclosure is illustrated, and is generally identified by the numeral 10. Enclosure 10 includes a side wall 12 and a side wall 14. Side wall 12 includes an extension 16. Side wall 14 includes an extension 18. Extensions 16 and 18 form a portion of a top 20 for enclosure 10.

Disposed between side walls 12 and 14 is a front door, generally identified by the numeral 24, and a rear door, generally identified by the numeral 26. Door 24 includes pivotally interconnected panels 24a, 24b, and 24c. Door 26 includes pivotally interconnected panels 26a, 26b, and 26c. FIG. 1 illustrates door 24 in a fully closed position and door 26 in a fully open position. FIG. 2 illustrates door 24 in a partially open position, and FIG. 3 illustrates door 24 in a fully opened position. Doors 24 and 26 are slidable between walls 12 and 14 in a track 30 (FIG. 2) formed within side walls 12 and 14. Doors 24 and 26 are maintained in an open position as illustrated in FIGS. 1 and 3 by panel 24c engaging a notch 32 (FIG. 4) contained within side walls 12 and 14.

Disposed between side walls 12 and 14 and below door panel 24c and below door panel 26c is a battery door 36 and 38, respectively, which is pivotally mounted to side walls 12 and 14. FIG. 1 illustrates battery door 36 in a closed position whereas FIG. 2 illustrates battery door 38 open. FIGS. 2 and 3 illustrate battery door 36 in the open position. Side walls 12 and 14 include ventilation apertures 42. Battery doors 36 and 38 include ventilation apertures 44.

Side walls 12 and 14 and doors 24, 26, 36, and 38 may be fabricated from plastic material, such as, for example, high density polyethylene and linear low density polyethylene plastic material having a double walled construction. Additionally, side walls 12 and 14 and doors 24, 26, 36, and 38 may be fabricated from blow molded plastic, sheet molded plastic, structural foam, fiberglass, and metal. Double wall construction allows for insulative type material to be disposed between the double walled panels of side walls 12 and 14 and doors 24, 26, 36, and 38. Insulated material may include, for example, expanding foam and fiberglass. As will subsequently described, side walls 12 and 14 and doors 24 and 26 are easily installed to form enclosure 10. A side wall 12 or 14 and door 24 or 26 may be easily replaced in the field without disrupting operation of the equipment enclosed within enclosure 10 or requiring the entire replacement of enclosure 10 in the event of a single component of enclosure 10 requiring replacement due to damage. Enclosure 10 may be fabricated in the field by assembling side walls 12 and 14 to doors 24 and 26 and a base to be subsequently described. Enclosure 10 can easily be disassembled in the field to replace damaged components to enlarge enclosure 10 as will subsequently be described with respect to FIGS. 5 and 6 without regard to operation of components housed within enclosure 10.

Figure 4:
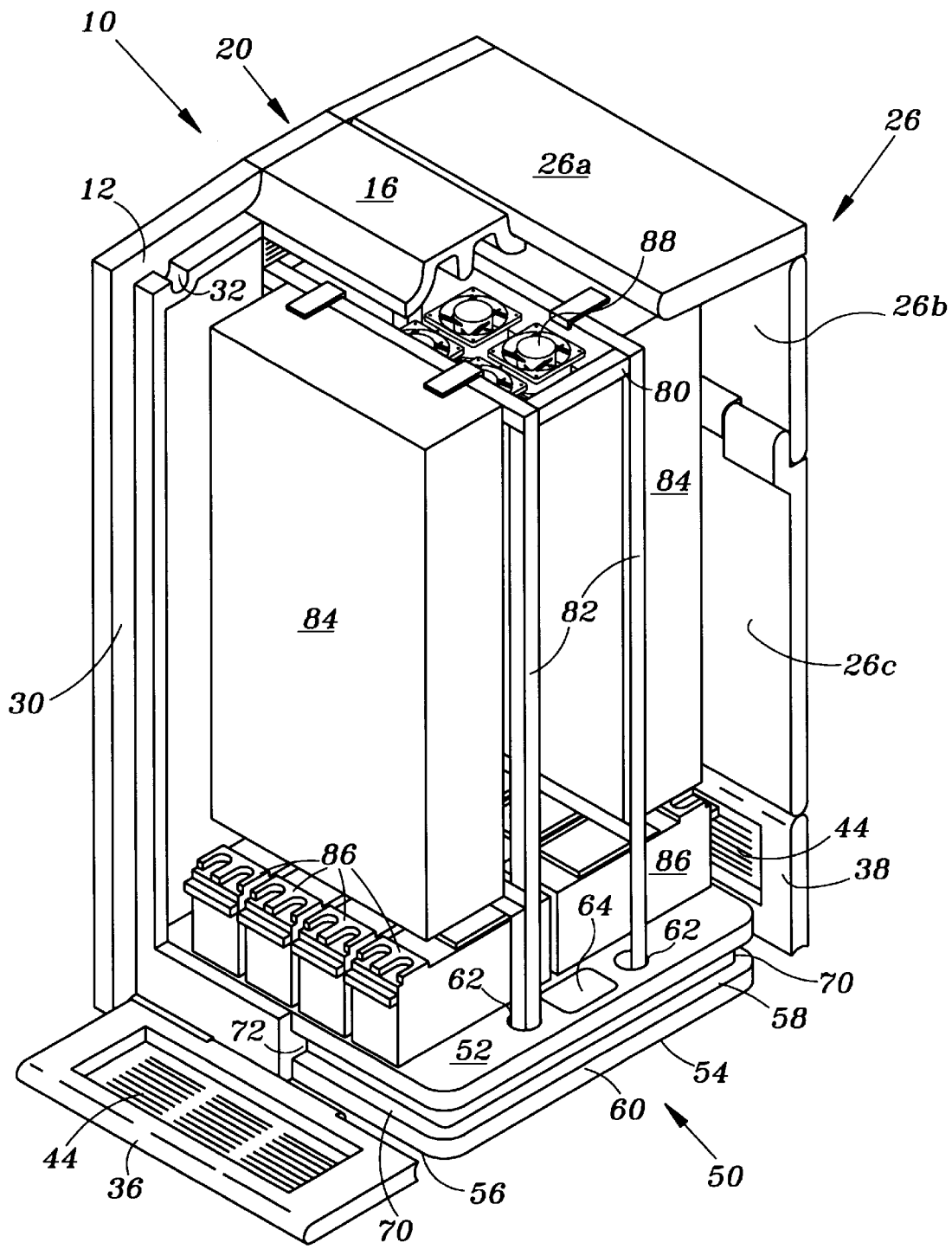
FIG. 4 is a perspective view of the present enclosure of FIG. 1 having the front door and a side wall removed, illustrating the interior of the present enclosure.

Referring now to FIG. 4, enclosure 10 further includes a base, generally identified by the numeral 50. Base 50 includes a top wall 52, a bottom wall 54, a front wall 56, a rear wall 58, and side walls 60. Top 52, bottom 54, and walls 56, 58 and 60 form a hollow chamber 64 for base 50. Hollow chamber 64 receives a ballast, such as, for example, concrete which is introduced into the interior of base 50 through apertures 62 contained within top 52 of base 50.

Front wall 56 and rear wall 58 of base 50 include a groove 70 for receiving a tongue 72 contained within side walls 12 and 14. Base 50 thereby supports side walls 12 and 14 of enclosure 10.

Also supported by base 50 is a frame 80 having legs 82. Legs 82 extend through apertures 62 of top wall 52 of base 50 and may be integrally attached to base 50 through the ballast contained within base 50. Attached to frame 80 are interior enclosures 84 for housing electronic and/or mechanical components within enclosure 10. Interior enclosures 84 are spaced apart from side walls 12 and 14 and doors 24 and 26 within enclosure 10 to provide additional protection for components housed therein. Additional components within enclosure 10 may include, for example, batteries 86 supported on top wall 52 of base 50 and ventilation fans 88 for circulating air within enclosure 10.

Figure 5:
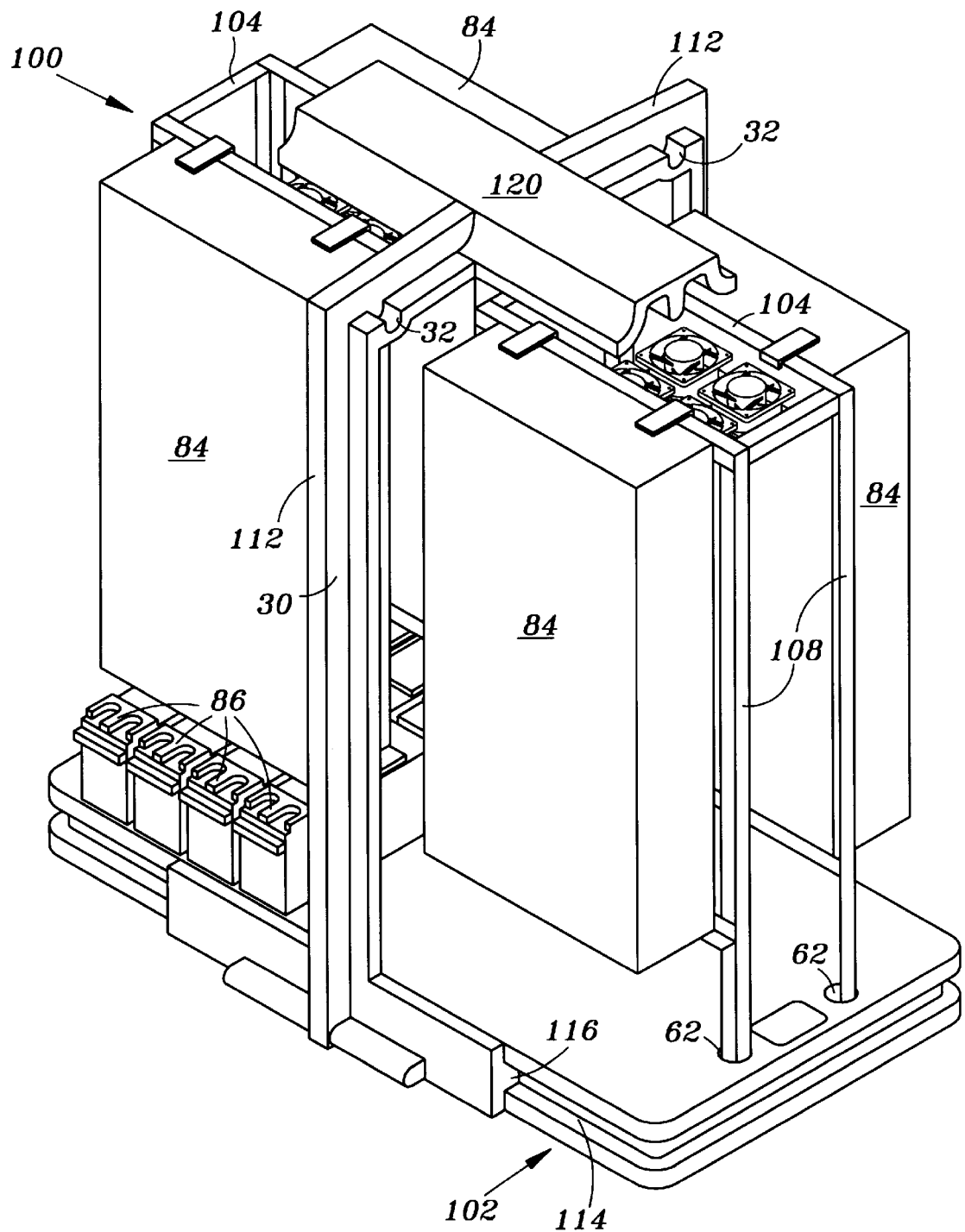
FIG. 5 is a perspective view of an enlarged enclosure in accordance with the modularity aspects of the present invention with the doors and side walls removed.
Figure 6:
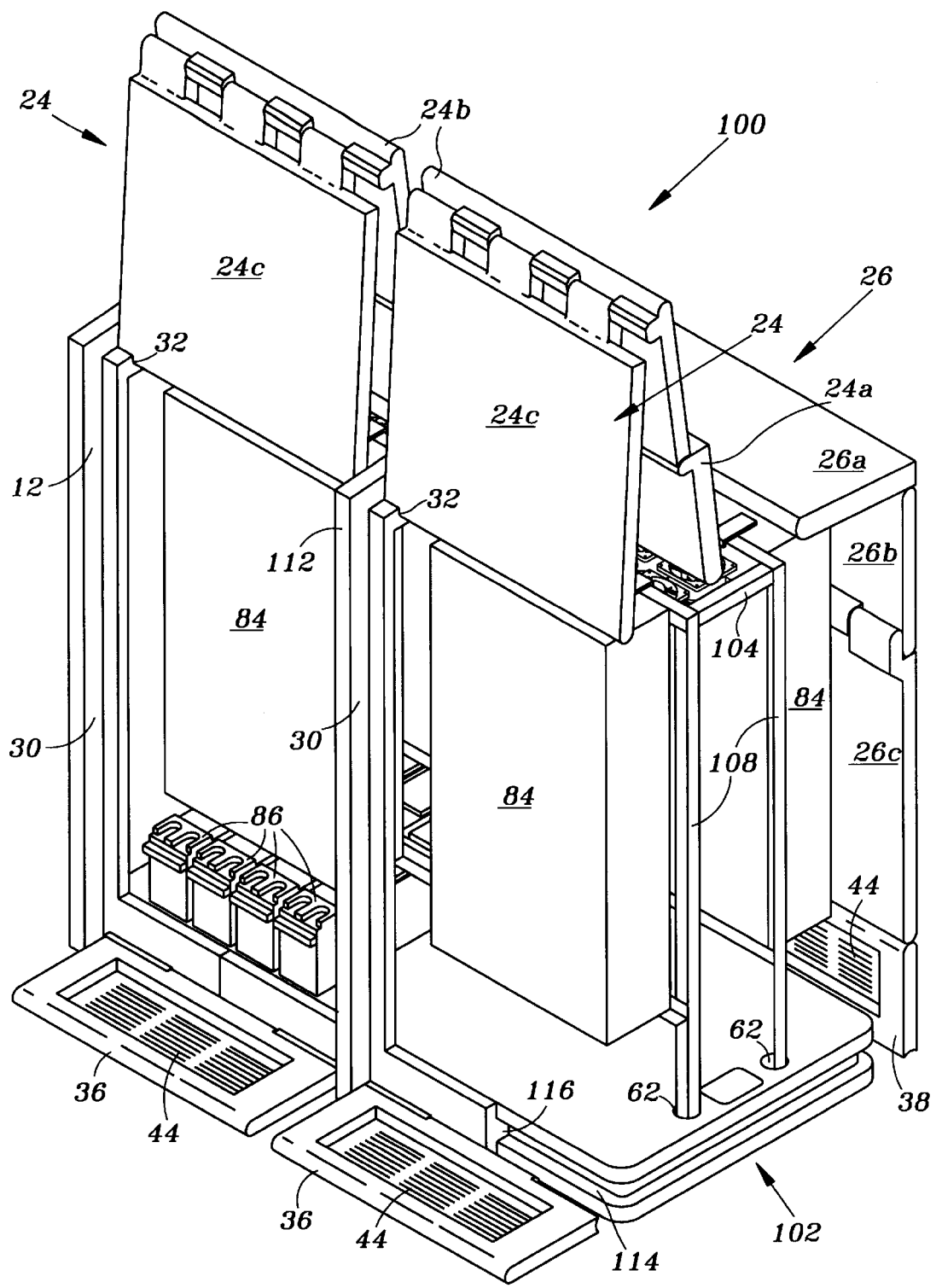
FIG. 6 is a perspective view of the enclosure of FIG. 5 with doors and one side wall included.

Referring now to FIGS. 5 and 6, the modularity of enclosure 10 allows enclosure 10 to be easily expanded inside to accommodate additional interior enclosures 84 and expand the size of enclosure 10 while utilizing side walls 12 and 14. FIGS. 5 and 6 illustrate an enclosure 100 which is approximately twice as large as enclosure 10. Enclosure 100 includes a base 102 similar in construction to base 50 (FIG. 4) for supporting a frame 104 having legs 108. Frame 104 supports four enclosures 84. Base 102 supports a support structure 112 which is centrally disposed on base 102. Support structure 112 engages base 102 within grooves 114 using a tongue 116. Support structure 112 further includes a top portion 120 which forms a portion of top 20 for enclosure 100 together with top portions 16 and 18 of side walls 12 and 14, respectively. Base 102 may comprise two bases 50 disposed side by side, or a single structure for supporting enclosure 100.

FIG. 6 illustrates enclosure 100 including two doors 24 and two doors 26 as well as side wall 12. Side wall 12 engages base 102 in a manner similar to side wall engaging base 50. Additionally, side wall 14 engages base 102 in a manner similar to side wall 14 engaging base 50 (FIG. 5). Battery doors 36 and 38 are disposed between support 112 and side walls 12 and 14, respectively. It therefore can be seen that enclosure 10 can be easily expanded into enclosure 100 by installation of support 112, multiple bases 50, and additional doors 24 and 26. Side walls 12 and 14 are reusable for enclosure 100. Enclosure 100 results in the expansion over enclosure 10 for housing two additional enclosures 84 as well as additional batteries 86. Enclosure 100 can be similarly expanded to include additional enclosures 84 by adding an additional support structure 112 and expanding the size of base 102.

Whereas the present invention has been described with respect to specific embodiments thereof, it will be understood that various changes and modifications will be suggested to one skilled in the art and it is intended to encompass such changes and modifications as fall within the scope of the appended claims.

We claim:

1. A modular enclosure comprising:
    a base having a front wall, a rear wall, and spaced apart first and second end walls, spaced apart a distance;
    a first side wall interconnected to said base rear wall and said base front wall;
    a second side wall interconnected to said base rear wall and said base front wall, and spaced apart a distance from said first side wall;
    a top connected to said side walls;
    means for selectively expanding said distance between said first and second side walls for increasing the size of the enclosure while utilizing said first and second side walls said expanding means including a support disposed between said first and second side walls and interconnected to said base rear wall and said base front wall and said top;
    a door disposed between said first side wall and said support adjacent said base front wall;
    a door disposed between said second side wall and said support adjacent said base front wall;
    a wall disposed between said first side wall and said support adjacent said base rear wall;
    a wall disposed between said second side wall and said support adjacent said base rear wall; and
    said base disposed between said first and second side walls and interconnected to said support.

2. The enclosure of claim 1 wherein said side walls include plastic material.

3. The enclosure of claim 1 wherein said base includes plastic material.

4. A modular enclosure for housing electronic components comprising:
    a base having a front wall, a rear wall, and spaced apart first and second end walls;
    a frame attached to said base;
    an interior enclosure for housing the electronic components, said interior enclosure being attached to said frame;
    a first side wall interconnected to said base rear wall and said base front wall and spaced apart from said interior enclosure;
    a second side wall interconnected to said base rear wall and said base front wall, and spaced apart a distance from said first side wall and spaced apart from said interior enclosure;
    a top connected to said side walls;
    means for selectively expanding said distance between said first and second side walls for housing various sized components within the enclosure while utilizing said first and second side walls said expanding means including a support disposed between said first and second side walls and interconnected to said base rear wall and said base front wall and said top.
    a door disposed between said first side wall and said support adjacent said base front wall;
    a door disposed between said second side wall and said support adjacent said base front wall;
    a wall disposed between said first side wall and said support adjacent said base rear wall;
    a wall disposed between said second side wall and said support adjacent said base rear wall;
    said base disposed between said first and second side walls and interconnected to said support; and
    said interior enclosure being completely enclosed by said walls, said doors, said top and said base.

5. The enclosure of claim 4 wherein said side walls include plastic material.

6. The enclosure of claim 4 wherein said base includes plastic material.

7. The enclosure of claim 4 wherein said interior enclosure includes metal material and said side walls include plastic material.

8. The enclosure of claim 7 wherein said plastic material is rotationally molded.

* * * * *